United States Patent [19]

Okazawa

[11] Patent Number: 4,700,212
[45] Date of Patent: Oct. 13, 1987

[54] SEMICONDUCTOR INTEGRATED CIRCUIT DEVICE OF HIGH DEGREE OF INTEGRATION

[75] Inventor: Takeshi Okazawa, Tokyo, Japan

[73] Assignee: NEC Corporation, Japan

[21] Appl. No.: 839,450

[22] Filed: Mar. 3, 1986

Related U.S. Application Data

[63] Continuation of Ser. No. 539,338, Oct. 5, 1983.

[30] Foreign Application Priority Data

Oct. 6, 1982 [JP] Japan ................................ 57-175954

[51] Int. Cl.⁴ ........................................... H01L 27/02
[52] U.S. Cl. .................................... 357/41; 357/23.11;
357/42; 357/44; 357/90; 357/50; 357/48; 357/49
[58] Field of Search ................ 357/23.11, 23.12, 23.9, 357/41, 23.1, 42, 90, 50, 47, 48, 45, 49, 44

[56] References Cited

U.S. PATENT DOCUMENTS

| | | | |
|---|---|---|---|
| 3,920,481 | 11/1975 | Hu | 357/42 X |
| 3,946,419 | 3/1976 | DeWitt et al. | 357/23.11 |
| 3,974,516 | 8/1976 | Steinmaier | 357/42 |
| 4,016,594 | 4/1977 | Shappir | 357/42 X |
| 4,027,380 | 6/1977 | Deal et al. | 357/42 X |
| 4,205,330 | 5/1980 | Klein | 357/23.12 |
| 4,261,772 | 4/1981 | Lane | 357/45 X |
| 4,378,565 | 3/1983 | Ghezzo et al. | 357/49 X |
| 4,385,947 | 5/1983 | Halfacre | 357/23.11 X |
| 4,470,852 | 9/1984 | Eusworth | 357/42 X |
| 4,477,310 | 10/1984 | Park et al. | 357/41 X |
| 4,487,639 | 12/1984 | Lam et al. | 357/41 X |
| 4,488,162 | 12/1984 | Jambotkar | 357/23.11 |
| 4,493,740 | 1/1985 | Komeba | 357/49 X |
| 4,506,437 | 3/1985 | Godejahn, Jr. | 357/45 X |
| 4,520,552 | 6/1985 | Arnould et al. | 357/49 X |
| 4,523,369 | 6/1985 | Nagakubo | 357/49 |

FOREIGN PATENT DOCUMENTS 3100288 12/1981 Fed. Rep. of Germany ........ 357/49

Primary Examiner—Andrew J. James
Assistant Examiner—William A. Mintel
Attorney, Agent, or Firm—Laff, Whitesel, Conte & Saret

[57] ABSTRACT

The present invention relates to a semiconductor integrated circuit device of high degree of integration. A first element region and a second element region are provided with a field insulating film interposed therebetween on a semiconductor substrate of one conductivity type. Impurity regions of one conductivity type having a high impurity concentration are separately formed in the substrate at locations of the first and second element regions, respectively. The respective impurity regions are wider that the respective element regions, and extends under end portions of the field insulating film but not under the center portion thereof. A wiring layer is provided on the center portion of the field insulating film beneath which no impurity region exists. The element regions are isolated from each other by a predetermined threshold voltage determined by the end portions of the field insulating film and by the underlying high impurity regions. Further, parasitic capacity can be reduced between the wiring layer and the semiconductor substrate since no impurity region having high concentration exists under the wiring layer.

3 Claims, 14 Drawing Figures

SEMICONDUCTOR INTEGRATED CIRCUIT DEVICE OF HIGH DEGREE OF INTEGRATION

This is a continuation of U.S. patent application Ser. No. 539,338, filed Oct. 5, 1983, now abandoned.

BACKGROUND OF THE INVENTION

The present invention relates to semiconductor integrated circuit devices, and more particularly to semiconductor integrated circuit devices in which insulated gate type field effect transistors (hereinafter referred to as MOSFET's) are formed in relatively small sizes to realize a high degree of integration.

Generally, a semiconductor integrated circuit device includes a plurality of elements (such as MOSFET's) which may be provided in a semiconductor substrate with isolation regions formed among these elements. In the prior art, the isolation region comprises a thick field insulating film partially buried in the semiconductor substrate, and a channel stopper region formed beneath the field insulating film. The channel stopper region has the same conductivity type that the semiconductor substrate has and an impurity concentration which is higher than the impurity concentration of the substrate. The isolation region works to effectively isolate the individual elements from each other even where a wiring layer with a channel-forming voltage runs on the field insulating film.

Recently, circuit elements in the semiconductor integrated circuit device become progressively smaller in size to provide a higher degree of integration. In this case, it is necessary to reduce the size in three dimensions, i.e., to reduce the size in the vertical direction as well as in the lateral direction.

When the field insulating film is formed, its end appears in the active region to some extent depending upon the thickness of the film to form a so-called "bird's beak". In the case of a large element, i.e., where the element has a large active region as in the conventional art, the biting amount may be negligible. However, where the element is to be formed in a small size, the bird's beak becomes a serious problem. Therefore, the thickness of the field insulating film must be reduced to decrease the amount of biting. For the purpose of enchancing the integration density, the width of the wiring layer must also be reduced from, for example, 3 to 4 $\mu$m to about 1 $\mu$m in order to reduce the planar area.

In this case, the thickness of the wiring layer must also be reduced because of its side etching phenomenon, and the like, in the patterning process. The wiring layer having the reduced thickness is apt to break off at a step portion between the surface of the substrate and the upper surface of the field insulating film. Therefore, the thickness of the field insulating film cannot be made very large. From the viewpoint of a manufacturing process, an aligning of the mask with a high precision is essential for effecting fine patterning. For this purpose, the surface of the semiconductor substrate must be as flat as possible. That is, as the size is reduced in a planar shape, the size must also be reduced in a three dimensional shape, to obtain a substantially flat surface.

In view of these requirements, the thickness of the field insulating film must be reduced in the isolation regions among the elements. Here, there is a problem since the isolation of the elements decreases, i.e., a threshold voltage $V_{th}$ in the field region decreases. However, this problem can be solved if the concentration of the channel stopper region is increased. According to the conventional art, however, a remaining unsolved problem is that of parasitic capacity which occurs between the wiring layer provided on the field insulating film and the semiconductor substrate. That is, if an attempt is made to reduce the thickness of the field insulating film in order to reduce the size, the parasitic capacity tends to increase because of the reduced thickness of the field insulating film. Moreover, if the impurity concentration of the channel stopper region is increased to prevent the threshold voltage from being decreased, the parasitic capacity increases further. This fact seriously hinders the semiconductor device from operating at a high speed.

SUMMARY OF THE INVENTION

The object of the present invention therefore is to provide a semiconductor device which effectively restrains the parasitic capacity between the wiring layer extending on the field insulating film and the semiconductor substrate, even when the thickness of the field insulating film is reduced as a result of an reduction in the size of elements, for realizing a higher degree of integration.

According to one feature of the present invention, a semiconductor integrated circuit comprises a semiconductor substate of one conductivity type. A field insulating film is selectively formed on a major surface of the semiconductor substrate. First and second element regions are provided in the substrate, respectively, with the field insulating film interposed therebetween. First and second impurity regions of one conductivity type having an impurity concentration which is higher than the concentration of the region of the semiconductor substrate which separately formed in the semiconductor substrate at the locations of the first and second impurity regions, respectively. The first and second impurity regions are respectively wider than the first and second element regions and extend under end portions of the field insulating film, and wiring layer formed on the center portion of the field insulating film. In the above-mentioned structure, the isolation between the first and second element regions is maintained by a threshold voltage obtained by the end portions of the field insulating film and the underlying first and second impurity region.

Concerning the parastic capacitance between the wiring layer and the substrate, it is restrained at a low value because the high impurity region does not exist under the wiring layer. Therefore the capacity due to the depletion layer is reduced. Favorably, the impurity concentration of the first and second impurity regions has its distribution in the depth direction such that the maximum concentration is positioned in the vicinity of the bottom surface of the field insulating film. Such a distribution may realize a high threshold voltage at the isolation region for complete isolation and a high breakdown voltage of source and drain region.

In each element region, a single MOSFET or a plurality of MOSFET's may be formed. The threshold voltage of the MOSFET may be controlled by introducing impurities of the opposite conductivity type into the channel region of the MOSFET. Moreover, in the present invention, the field insulating film is in contact on both ends with the channel region at right angles to the direction of source and drain regions. The entire area of the channel width between the field insulation films can exhibit substantially the uniform threshold voltage.

BRIEF DESCRIPTION OF THE DRAWINGS

FIGS. 2A and 2B are a cross-sectional view and a plan view showing an embodiment of the present invention, wherein FIG. 2A is a cross-sectional view taken along the line A—A' in FIG. 2B as viewed in the direction of arrows;

FIGS. 5 to 7 illustrate other effects according to the present invention, wherein FIG. 5 is a plan view schematically illustrating the MOSFET;

FIG. 6 is a cross-sectional view of a prior MOSFET illustrated on an enlarged scale as viewed in the direction of the arrow along the line B—B' of FIG. 5; and FIG. 7 is a cross-sectional view of a MOSFET according to the present invention, illustrated on an enlarged scale as viewed in the direction of the arrow along the line B—B' of FIG. 5.

DESCRIPTION OF THE PRIOR ART

Figure 1:
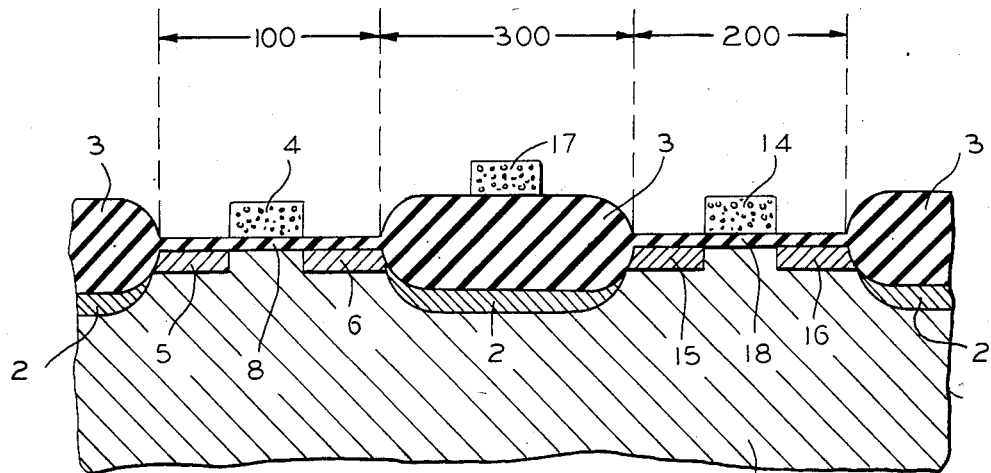
FIG. 1 is a cross-sectional view showing a semiconductor device according to a prior art.

FIG. 1 shows an MOS integrated circuit of the prior art. A first element region 100 and a second element region 200 are formed on a P-type semiconductor substrate 1 having the impurity concentration of $1 \times 10^{15}$ cm$^{-3}$. An isolation region 300 is formed on the substrate 1 between these two element regions. The isolation region 300 consists of a thick field oxide film 3 having 1 μm thickness and being partially buried in the substrate. A P-type channel stopper region 2 has an impurity concentration as high as about $1 \times 10^{16}$ cm$^{-3}$ and is provided under the entire bottom of the field oxide film 3. The isolation region exhibits a threshold voltage of 20 volts.

A wiring layer is formed on the field oxide film 3. More articularly, a wiring layer 17 of polycrystalline silicon extends on the center portion of the field oxide film 3. A parasitic capacity Cp of $5 \times 10^{-5}$ pF/μm$^2$ exists between the wiring layer 17 and the semiconductor substrate 1. In the first element region 100 is formed a first MOSFET which includes N-type source and drain regions 5, 6 having an impurity concentration of about $1 \times 10^{20}$ cm$^{-3}$. A gate insulating film 8 is formed on the channel region between these two regions 5, 6, and a gate electrode 4 composed of polycrystalline silicon is positioned over the gate insulating film 8.

Similarly, a second MOSFET is formedin the second element region 200, including N-type source and drain regions 15, 16. A gate insulating film 18 is formed on the channel region between these two regions 15, 16. A gate electrode 14 is composed of polycrystalline silicon on the gate insulating film 18. FIG. 1 does not show electrode layers connected to the source and drain regions 5, 6, 15 and 16.

In the prior art semiconductor device of this kind, the gate electrodes 4, 14 have a length of about 3 μm between the source and drain regions. The element regions 100, 200 have a length of about 10 μm in the same direction. The field oxide film 3 of 1 μm thickness protrudes, by about 0.55 μm, beyond the surface of the substrate. Therefore, the surface of this construction can be regarded as being substantially flat.

However, if an attempt is made to increase the degree of integration by reducing the size of element regions 100, 200, the height of field insulating film 3 becomes a problem. For example, if the length of gate electrodes 4, 14 is reduced to 1 μm, and the length of element regions 100, 200 is reduced to 3 to 4 μm, the height of field insulating film 3 must be reduced correspondingly. Otherwise, the step on the surface which is caused by the film thickness becomes too great and that decreases the yield of production. When the size of the element is reduced, as mentioned above, the thickness of the field insulating film must also be reduced to, for example, 0.5 μm. In this case, the height beyond the surface of the substrate will be about 0.28 μm, and the device can be regarded as having a substantially flat surface. However, if the sizes are reduced in accordance with the prior art, the parasitic capacity Cp becomes $7 \times 10^{-5}$ pF/μm$^2$ between the wiring layer 17 and the semiconductor substrate 1 which is an increase of 40% as compared with the aforementioned value, and that increase hinders high-speed operation of the semiconductor device.

DESCRIPTION OF THE EMBODIMENTS

Figure 2A:
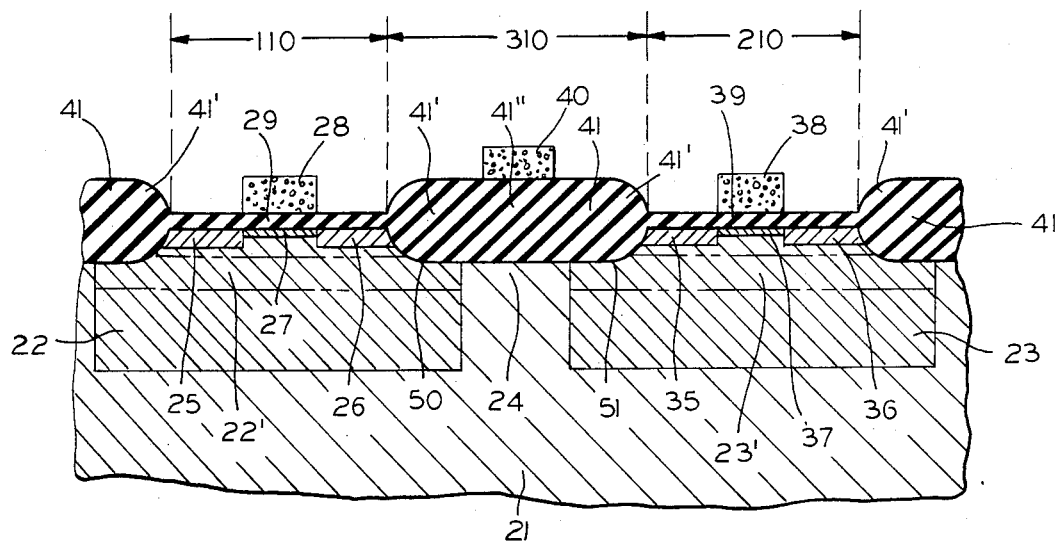
Figure 2B:
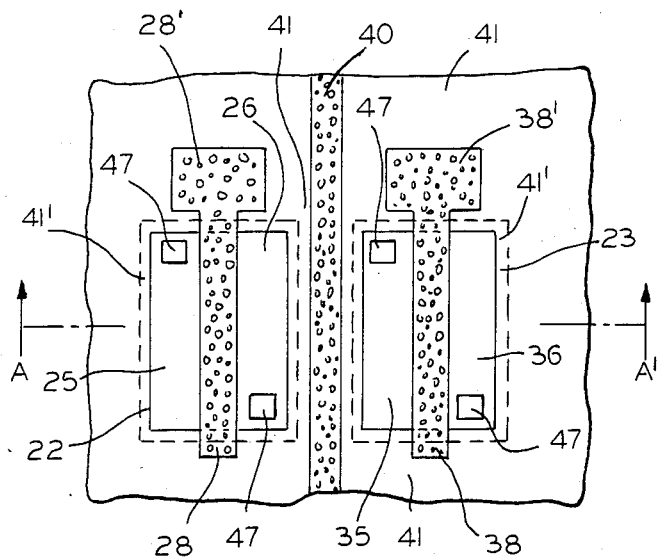

FIGS. 2A and 2B illustrate an embodiment of the present invention in which the size of elements and the thickness of field insulating film are reduced. In a P-type semiconductor substrate 21 which has an impurity concentration of $1 \times 10^{15}$ cm$^{-3}$, highly doped P-type regions 22, 23 are separately formed which have an average impurity concentration of $1 \times 10^{16}$ cm$^{-3}$. A first element region 110 and a second element region 210 are formed on the highly P-type regions 22 and 23, respectively. An isolation region 310 is formed between these two elements regions.

In the isolation region is formed a silicon oxide film 41 which is 0.5 μm thick and partially buried in the substrate. The highly doped P-type regions 22, 23 have inner portions 22', 23' that have a slightly high impurity concentration of 3 to $4 \times 10^{16}$ cm$^{-3}$ that are surrounded by two-dot chain lines. This can be done by controlling the energy for injecting ions at the time of forming these P-type regions. The P-type regions 22, 23 are extended under end portions 41' of the field silicon oxide film 41, but not under the center portion 41" of the field silicon oxide film 41. Namely, under the polycrystalline silicon wiring layer 40 that runs on the field silicon oxide film 41, the highly doped P-type regions 22, 23 do not exist.

With this structure, the isolation between the two element regions are sufficiently maintained because a threshold voltage at the end portions 41' of the field silicon oxide film is about 20 volts owing to the presence of the underlying, extended P-type regions 22, 23. In particular, the extended portions 50, 51 of the P-type regions 22, 23 have an impurity concentration as high as 3 to $4 \times 10^{16}$ cm$^{-3}$. On the other hand, the parasitic capacity between the wiring layer 40 is formed on the center portion 41" of the field insulating film 41 and the semiconductor substrate 21 is $5 \times 10^{-5}$ pF/μm$^2$ which is comparable to that of FIG. 1, despite the fact that the thickness of the field oxide film 41 is reduced to 0.5 μm. This is because, the semiconductor substrate 21 has a small concentration of $1 \times 10^{15}$ cm$^{-3}$ in the area 24 under the center portion 41" of the field insulating film 41. The capacity due to the depletion layer is reduced. This is an important feature of the present invention.

In the first element region 110, N-type source and drain regions 25, 26 having a concentration of about $1 \times 10^{20}$ cm$^{-3}$ are formed. A polycrystalline silicon gate electrode 28 is provided via a gate insulating film 29. Further, since the P-type region 22 has an average impurity concentration of $1 \times 10^{16}$ cm$^{-3}$, N-type impurities such as arsenic ions are introduced beforehand into the channel region 27 to lower the P-type impurity concentration of the channel region 27, to control the threshold voltage of a first MOSFET thus formed in the first element region 110.

Similarly, N-type source and drain regions 35, 36 are formed in the second element region 210. The N-type impurities are introduced into a channel region 37 between the regions 35 and 36, so that the channel region 37 assumes the P-type containing impurities at a small concentration. Then, a silicon gate electrode 38 is formed on the channel region 37 via a gate insulating film 39, to form a second MOSFET. In this embodiment the N-type source and drain regions 25, 26, 35 and 36 are not in contact with the inner portions 22', 23' of higher impurity concentration in the region 22, 23. Therefore, the breakdown voltage of the source and drain region is not reduced.

Referring to FIG. 2B, the silicon gate electrodes 28, 38 are equipped with contact portions 28', 38', and aluminum wiring layers (not shown) are connected thereto. Further, the source and drain regions 25, 26, 35 and 36 are provided with contact portions 47, respectively, and aluminum wiring layers (not shown) are connected thereto.

A process for manufacturing the device of the embodiment of FIG. 2 will be described below briefly in conjunction with FIG. 3, in which the portions having the same functions as those of FIG. 2 are denoted by the same reference numerals.

Figure 3A:
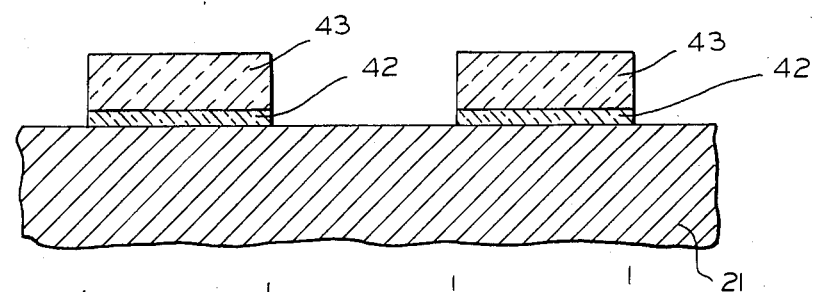
FIGS. 3A to 3G are cross-sectional views illustrating the steps for producing the devices of the embodiment of the present invention.
Figure 3B:
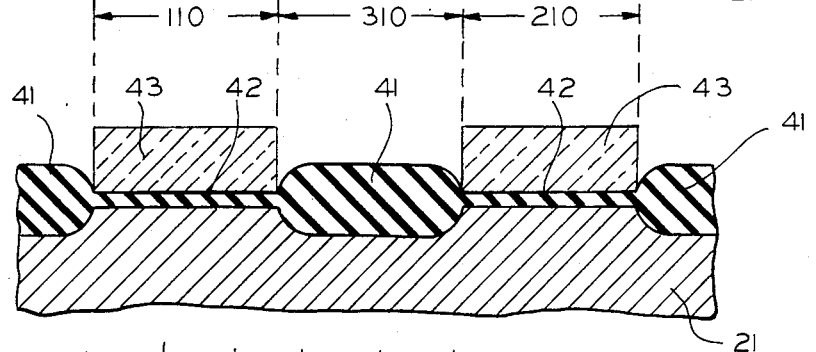

First, a thin silicon oxide film 42 and a silicon nitride film 43 are selectively formed on the P-type semiconductor substrate 21 (FIG. 3A), which is then oxidized at a temperature of about 1000° C. in an oxidizing atmosphere, to form a field silicon oxide film 41 which is 0.5 μm thick (FIG. 3B).

Figure 3C:
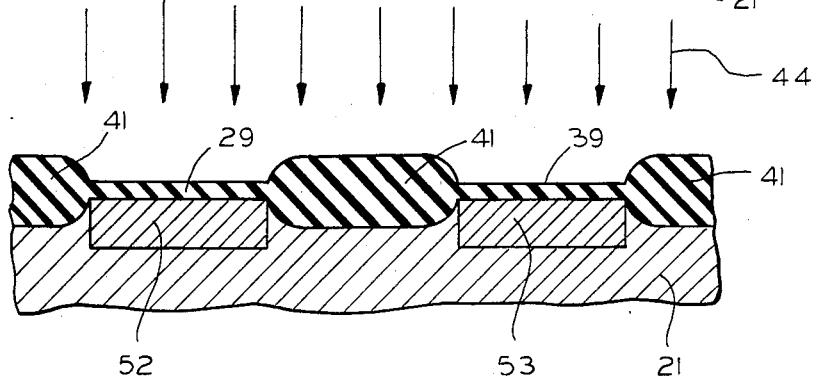
Figure 3D:
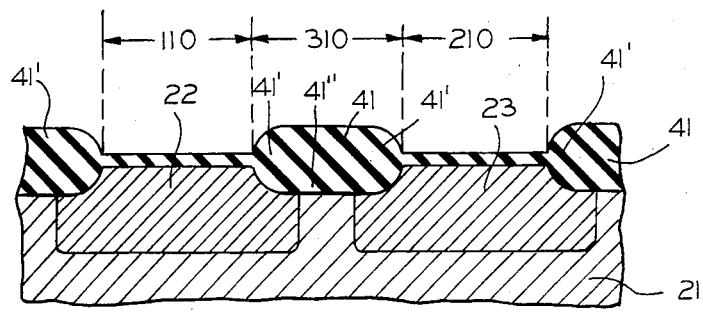
Figure 3E:
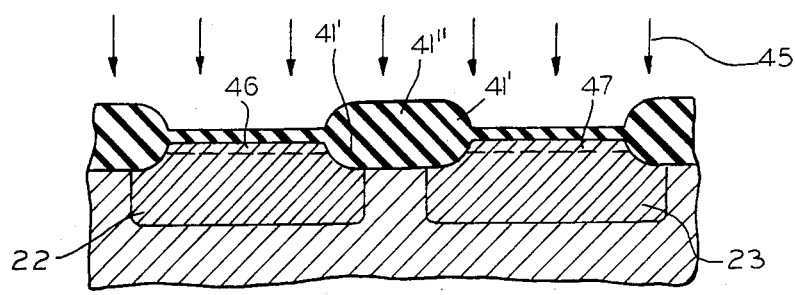
Figure 3F:
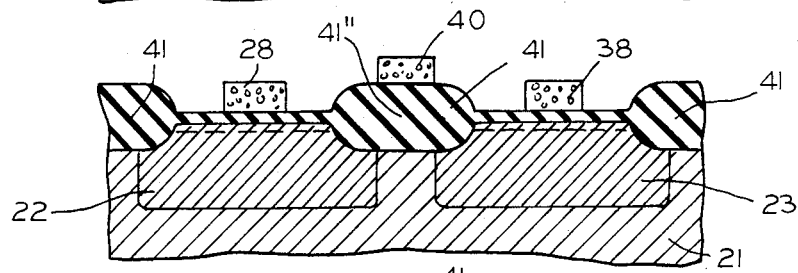
Figure 3G:
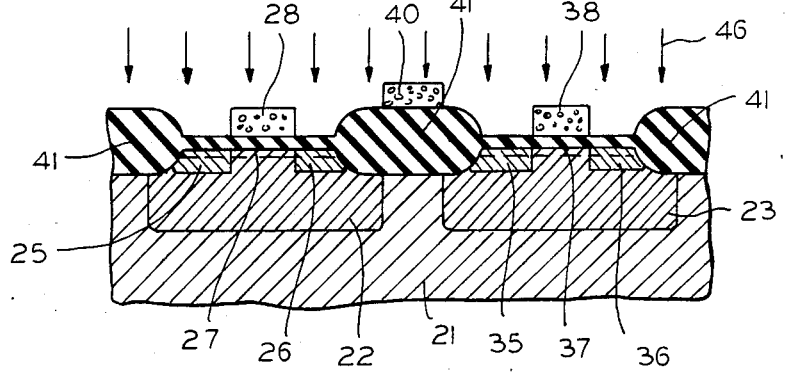

Then, the silicon nitride film 43 and the silicon oxide film 42 are removed. The gate oxide films 29, 39 are newly formed. Using the field oxide film 41 as a mask, boron ions 44 are injected at about 150 KV in a dosage of $1 \times 10^{12}$ cm$^{-2}$ to form P-type regions 52, 53 (FIG. 3C). A heat treatment follows at about 1000° C. in an inert atmosphere for 30 to 60 minutes, so that boron ions in the P-type regions 52, 53 are further driven down and, at the same time, are diffused in to areas under the end portions 41' of the field oxide film 41, to form the highly doped P-type regions 22, 23 (FIG. 3D). Next, arsenic ions 45 are injected at about 50 to 70 KV in a dosage of about $10^{11}$ cm$^{-2}$ to convert the surface region of the highly doped P-type region into P$^-$-type regions 46, 47 (FIG. 3E) so that the channel region will have a predetermined threshold value. Thereafter, gate electrodes 28, 38 and wiring layers 40 composed of polycrystalline silicon are formed in desired shapes (FIG. 3F). Arsenic ions 46 are implanted in a dosage which may be, for example, as high as $10^{16}$ cm$^{-2}$ by using the gate electrodes 28, 38 and field silicon oxide film 41 as masks, followed by the heat treatment to form source and drain regions 25, 26, 35 and 36 (FIG. 3G).

Figure 4:
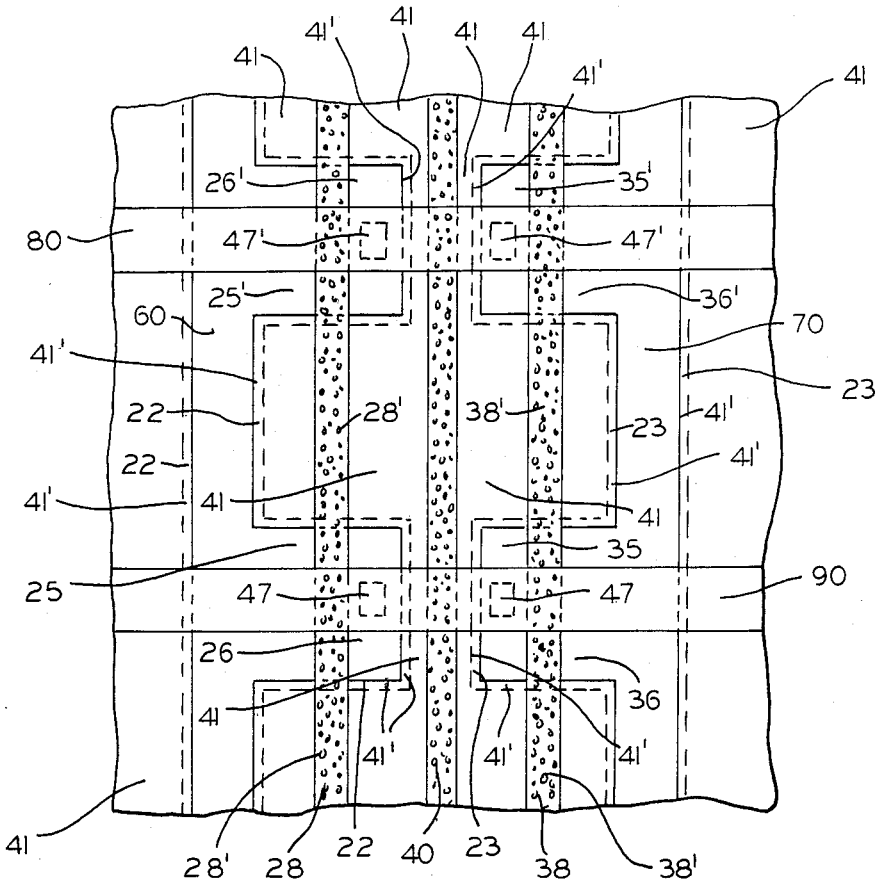
FIG. 4 is a plan view showing another embodiment of the present invention.

FIG. 4 illustrates another embodiment. In FIGS. 2 and 3, the first and second element regions surrounded by the field insulating film contain the first MOSFET and the second MOSFET, respectively. In the embodiment of FIG. 4, however, the first and second element regions include a plurality of MOSFET's, respectively. For easy comprehension, however, portions having the same functions as those of FIGS. 2 and 3 are denoted by the same reference numerals.

In the first element region, a common source line 60 extends in one direction in the semiconductor substrate and two source regions 25, 25' are connected thereto. Further, a common gate electrode 28 also extends in the one direction on the channel regions of the first element regions and on the field oxide film 41. Two drain regions 26 and 26' are formed on the opposite side of the drain regions 25 and 25', respectively, with respect to the gate electrode 28.

In the second element region, similarly, a common source line 70 extends in the mentioned one direction, to which two source regions 36, 36' are connected and a common gate electrode 38 extends in parallel with the source line 70. Two drain regions 35, 35' are formed on the opposite side of the source regions 36, 36'. One drain region 26 in the first element region and one drain region 35 in the second element region are connected to an aluminum wiring 90 running in the perpendicular direction at contact portions 47, 47. The other drain region 26' in the first element region and the other drain region 35' in the second element region are connected to an aluminum wiring 80 running in the perpendicular direction at contact portions 47', 47'. Even in this embodiment, the highly doped P-type regions 22, 23 of the present invention exist only within a region surrounded by a dotted line. A narrow belt region between this dotted line which represents the outer edges of the highly doped P-type regions and a solid line that represents the outer edges the N-type source line and N-type source and drain regions is the extended portion of the highly doped P-type regions underlying the end portions 41' of the field oxide film 41.

A high threshold voltage of the isolation region is maintained at the end portions 41' of the field insulating film 41 owing to the presence of the underlying, extended portions of the highly doped P-type regions. A wiring layer 40, on the other hand, runs on the field oxide film 41 outside the dotted lines, under which the highly doped P-type regions 22, 23 do not exist. Therefore, a small parastic capacity is kept between the wiring layer 40 and the semiconductor substrate. Further, portions 28', 38' of the gate electrodes 28, 38 run on the field oxide film 41 beneath which the highly doped P-type regions 22, 23 exists only partially. Therefore, the parasitic capacity is also small between the gate electrode and the substrate of field portion.

Figure 5:
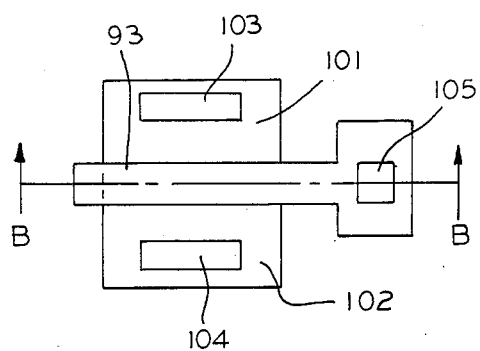

Another effect of the present invention will be described below in conjunction with FIGS. 5 to 7. In FIG. 5, a gate electrode 93 is formed on the channel region via a gate insulation film between the source region 101 and the drain region 102. Further, the source region, drain region and gate electrode are provided with contact portions 103, 104 and 105, respectively.

Figure 6:
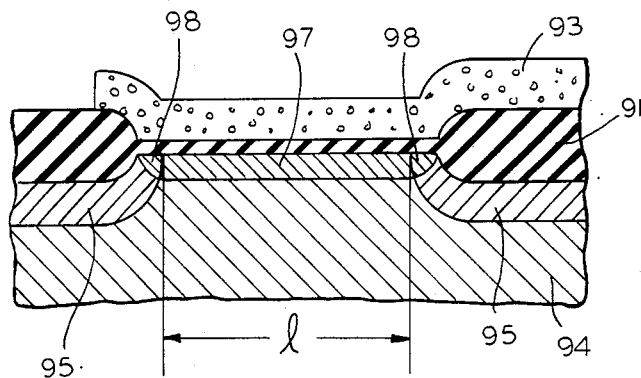
Figure 7:
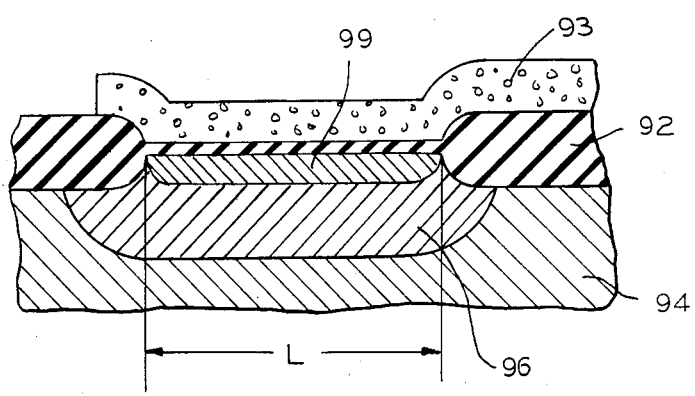

FIGS. 6 and 7 are cross-sectional views of an enlarged scale taken along line B—B' of FIG. 5, and illustrate the channel region in the direction of the width, i.e., illustrate the channel region at right angles with the direction of source and drain regions. In FIG. 6 which illustrates the prior art structure, a field oxide film 91 is formed on a P-type substrate 94 having an impurity concentration of $1 \times 10^{15}$ cm$^{-3}$, and a P-type channel stopper 95 having an impurity concentration of $1 \times 10^{16}$ cm$^{-3}$ is formed beneath the field oxide film 91. The P-type channel stopper region 95, however, stretches up to the peripheral surface portion 98 of the channel region. The central surface portion of the channel region, on the other hand, has a concentration equal to that of the substrate. Therefore, even if N-type impurities are introduced into the channel region 97 to control the threshold voltage of the channel region 97, the central portion of the channel region 97 and the end portions 98 possess different threshold voltages. Therefore, in the prior art, impurities are introduced such that the desired threshold voltage is obtained at the central portion of the channel region 97, which results in substantially a decrease in the channel width as indicated by l.

According to the present invention, on the other hand, a highly doped P-type region 96 having an impurity concentration of $1 \times 10^{16}$ cm$^{-3}$ is formed uniformly over the channel region 99. Therefore, if another type of impurities, in this case N-type, are introduced to control threshold voltage, the whole channel region 99 between field oxide film 92 exhibits a uniform threshold value. According to the present invention, the channel width is not decreased as indicated by L. That is, the MOSFET fully utilizes the active region between the isolation regions.

What is claimed is:

1. A semiconductor integrated circuit device comprising a semiconductor substrate of one conductivity type having a major surface, first and second element regions provided in said major surface of said substrate, a field insulating film partly embedded in said substrate from said major surface and provided between said first and second element regions, said field insulating film having first and second peripheral portions and a center portion between said first and second peripheral portions, said first peripheral portion of said field insulating film being abutted against said first element region, said second peripheral portion of said field insulating film being abutted against said second element region, a first insulated gate type field effect transistor formed in said first element region and having source and drain regions of the opposite conductivity type, a second insulated gate type field effect transistor formed in said second element region and having source and drain regions of the opposite conductivity type, a first impurity region of the same one conductivity type as said one conductivity type of said substrate and having a higher impurity concentration than the impurity concentration of said substrate, said first impurity region including a first section provided under said first element region of said major surface of said substrate so that said first section of said first impurity region is abutted against the bottoms of said source and drain regions of said first transistor, and a second section provided under said first section so that said second section of said first impurity region is separated from said bottoms of said source and drain regions of said first transistor and is abutted against the bottom of said first peripheral portion of said field insulating film, said second section of said first impurity region having a higher impurity concentration than the impurity concentration of said first section of said first impurity region, a second impurity region of the same one conductivity type as said one conductivity type of said substrate and having a higher impurity concentration of said substrate, said second impurity region including a first section provided under said second element region of said major surface of said substrate so that said first section of said second impurity region is abutted against the bottoms of said source and drain regions of said second transistor, and a second section provided under said first section so that said second section of said second impurity region is separated from said bottoms of said source and drain regions of said second transistor and is abutted against the bottom of said second peripheral portion of said field insulating film, said second section of said second impurity region having a higher impurity concentration than the impurity concentration of said first section of said second impurity region, said first and second impurity regions being free from a part of said substrate under said center portion of said field insulating film such that the impurity concentration of said part of said one conductivity type maintains a lower level than said impurity concentration of said first and second impurity regions, and a wiring layer formed on said center portion of said field insulating film and above said part of said substrate between said first and second impurity regions.

2. A semiconductor integrated circuit device comprising a semiconductor substrate of one conductivity type having a low impurity concentration, a first impurity region of said one conductivity type having an impurity concentration which is higher than the concentration of said substrate and being formed in said substrate, a second impurity region of said one conductivity type having an impurity concentration which is higher than the impurity concentration of said substrate and being formed in said substrate apart from said first impurity region, a field insulating film formed on said substrate between said first and second impurity regions and on peripheral parts of said first and second impurity regions such that end portions of said field insulating film are overlapped with said peripheral parts of said first and second impurity regions of said one conductivity type having said higher impurity concentration, a center portion of said field insulating film being located on said substrate of said one conductivity type having said low impurity concentration, a first group of circuit elements formed in said first impurity region, a second group of circuit elements formed in said second impurity region, each of said circuit elements of said first and second groups having a conductivity type which is opposite to said one conductivity type, and a wiring layer on said center portion of said field insulating film the impurity concentrations of said first and second impurity regions being maximum at such portions of said first and second impurity regions that are deeper than said first and second groups of circuit elements, respectively.

3. A semiconductor integrated circuit device comprising a semiconductor substrate of one conductivity type, said substrate having a first surface area, a second surface area and a third surface area located between said first and second surface areas, said third surface area being positioned at a level which is lower than said first and second surface areas and having a center portion and first and second end portions, a field insulating film formed entirely on said third surface area of said substrate, a first impurity region of one conductivity type formed from said first end portion of said third surface area of said substrate to an inner location of said substrate under and apart from said first surface area of said substrate, said first impurity region having an impurity concentration which is higher than the impurity concentration of said substrate at said center portion of said third surface area of said substrate, a second impurity region of one conductivity type formed from said second end portion of said third surface area of said substrate to an inner location under and apart from said second surface area of said substrate, said second impurity region having an impurity concentration which is higher than the impurity concentration of said substrate at said center portion of said third surface area of said substrate, a first element forming region of one conductivity type positioned beneath said first surface area and above said first impurity region, said first element forming region having an impurity concentration which is higher than the impurity concentration of said substrate and which is lower than the impurity concentration of said first impurity region, a second element forming region of one conductivity type positioned beneath said second surface area and above said second impurity region, said second element forming region having an impurity concentration which is higher than the impurity concentration of said substrate and lower than the impurity concentration of said second impurity region, a first circuit element formed at said first surface area on said first element forming region, a second circuit element formed at said second surface area on said second element forming region, and a wiring layer formed on said field insulating film and above said center portion of said third surface area of said substrate.

* * * * *